(12) United States Patent
Kashiwagi et al.

(10) Patent No.: US 8,481,656 B2
(45) Date of Patent: Jul. 9, 2013

(54) SILICONE RESIN COMPOSITION AND OPTICAL SEMICONDUCTOR DEVICE USING THE COMPOSITION

(75) Inventors: Tsutomu Kashiwagi, Annaka (JP); Yoshihira Hamamoto, Takasaki (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/441,115

(22) Filed: Apr. 6, 2012

(65) Prior Publication Data

US 2012/0256325 A1 Oct. 11, 2012

(30) Foreign Application Priority Data

Apr. 8, 2011 (JP) ................... 2011-086251

(51) Int. Cl.
*C08F 283/12* (2006.01)
*C08G 77/12* (2006.01)
*H01L 23/29* (2006.01)
*H01L 33/54* (2010.01)

(52) U.S. Cl.
USPC ...... 525/478; 528/31; 257/791; 257/E23.117; 257/E33.059

(58) Field of Classification Search
USPC .............. 525/478; 524/588; 257/E33.066, 257/99
See application file for complete search history.

(56) References Cited

U.S. PATENT DOCUMENTS

| | | | |
|---|---|---|---|
| 6,608,144 B1 * | 8/2003 | Nakamura et al. | ......... 525/331.7 |
| 2004/0241927 A1 | 12/2004 | Kato et al. | |
| 2005/0006794 A1 | 1/2005 | Kashiwagi et al. | |
| 2007/0112147 A1 | 5/2007 | Morita et al. | |
| 2007/0166470 A1 | 7/2007 | Kashiwagi | |
| 2008/0015326 A1 | 1/2008 | Kodama et al. | |
| 2008/0262158 A1 | 10/2008 | Morita et al. | |
| 2009/0118440 A1 | 5/2009 | Nakanishi et al. | |
| 2009/0179180 A1 | 7/2009 | Morita et al. | |
| 2010/0276721 A1 * | 11/2010 | Yoshitake et al. | .............. 257/99 |
| 2010/0301377 A1 | 12/2010 | Kato et al. | |
| 2011/0092647 A1 | 4/2011 | Morita et al. | |
| 2011/0160410 A1 | 6/2011 | Sagawa et al. | |

FOREIGN PATENT DOCUMENTS

| | | |
|---|---|---|
| JP | 2000-198930 | 7/2000 |
| JP | 2003-128922 | 5/2003 |
| JP | 2005-42099 | 2/2005 |
| JP | 2005-105217 | 4/2005 |
| JP | 2006-63092 | 3/2006 |
| JP | 2006-335845 | 12/2006 |
| JP | 2007-8996 | 1/2007 |
| JP | 2007-39483 | 2/2007 |
| JP | 2007-191504 | 8/2007 |
| JP | 2008-1828 | 1/2008 |
| JP | 2008-19385 | 1/2008 |
| JP | 2008-50494 | 3/2008 |
| JP | 2009-527622 | 7/2009 |
| JP | 2009-242627 | 10/2009 |
| JP | 2010-1335 | 1/2010 |

OTHER PUBLICATIONS

Extended European Search Report issued Aug. 6, 2012 in Patent Application No. 12002476.5.

* cited by examiner

*Primary Examiner* — Randy Gulakowski
*Assistant Examiner* — Christopher M Rodd
(74) *Attorney, Agent, or Firm* — Oblon, Spivak, McClelland, Maier & Neustadt, L.L.P.

(57) ABSTRACT

A silicone resin composition that exhibits low gas permeability and is suitable for encapsulating optical semiconductors. The composition includes: (A) an organopolysiloxane having a specific structure containing two or more alkenyl groups, (B) an organohydrogenpolysiloxane composed of two organohydrogenpolysiloxanes having specific structures, in which the mass ratio between the two organohydrogenpolysiloxanes is within a range from 10:90 to 90:10, in an amount that provides 0.4 to 4.0 mols of silicon atom-bonded hydrogen atoms within the component (B) per 1 mol of alkenyl groups within the component (A), and (C) an addition reaction catalyst.

8 Claims, No Drawings

SILICONE RESIN COMPOSITION AND OPTICAL SEMICONDUCTOR DEVICE USING THE COMPOSITION

BACKGROUND OF THE INVENTION

1. Field of the Invention

The present invention relates to a silicone resin composition that is useful as an encapsulating material for optical semiconductor elements, and an optical semiconductor device that uses the composition.

2. Description of the Prior Art

In recent years, high-brightness LEDs that exhibit strong light intensity and generate significant heat have become commercially available, and these high-brightness LEDs are now starting to be widely used, not only as the BLU devices within liquid crystal display televisions and mobile phones, but also within general lighting applications. JP 2010-1335 A (Patent Document 1) discloses that by adding an epoxy-containing silicone to a phenyl-containing silicone resin, the adhesiveness can be improved, enabling an encapsulating material to be provided that exhibits excellent heat resistance, light-resistant stability and weather resistance. Further JP 2009-527622 A (Patent Document 2) discloses a silicone resin composition comprising a phenyl-containing resin and a linear phenyl-containing hydrogenoligoorganosiloxane which is useful for extending the life of an LED.

In an LED package, a structure known as a lead frame that is prepared by silver plating a copper sheet is used. Depending on the conditions under which the LED is used, a sulfur fraction may be produced at the lead frame. It is known that if the gas permeability of the silicone used as the encapsulating material is high, then silver sulfide is produced at the silver surface over time, causing blackening of the surface. It is also known that this blackening of the lead frame causes a reduction in the brightness of the LED. Accordingly, low gas permeability is a desirable property for the encapsulating resin. Although phenyl-containing silicones are said to exhibit particularly low gas permeability even among silicone resins, it was discovered that when the compositions disclosed in the above Patent Documents 1 and 2, each of which uses a phenyl-containing silicone resin as the base component, were subjected to a sulfide test, the resistance to discoloration was unsatisfactory. It is generally accepted that the resistance to gas permeability can be improved by increasing the cross-linking density, but if the hardness of the cured product becomes too high, then other problems such as wire breakage or chip detachment can occur.

Patent Documents 3 to 15 also disclose phenyl-containing silicone compositions that are suitable for use with LEDs.

Patent Document 1: JP 2010-1335 A
Patent Document 2: JP 2009-527622 A
Patent Document 3: JP 2000-198930 A
Patent Document 4: JP 2003-128922 A
Patent Document 5: JP 2005-42099 A
Patent Document 6: JP 2005-105217 A
Patent Document 7: JP 2006-63092 A
Patent Document 8: JP 2006-335845 A
Patent Document 9: JP 2007-8996 A
Patent Document 10: JP 2007-39483 A
Patent Document 11: JP 2007-191504 A
Patent Document 12: JP 2008-1828 A
Patent Document 13: JP 2008-19385 A
Patent Document 14: JP 2008-50494 A
Patent Document 15: JP 2009-242627 A

SUMMARY OF THE INVENTION

Accordingly, an object of the present invention is to address the problems associated with conventional phenyl-containing silicones, and provide a silicone resin composition which yields a cured product having low gas permeability and a small elastic modulus upon heating, and which is ideal for encapsulating optical semiconductors.

Further, the present invention also has an object of providing a highly reliable optical semiconductor device that uses the above silicone resin composition.

As a result of intensive investigation aimed at achieving the above objects, the inventors of the present invention discovered that a silicone resin composition of the composition described below was able to achieve the above objects.

In other words, in order to achieve the objects described above, the present invention provides a silicone resin composition comprising:

(A) 100 parts by mass of an organopolysiloxane containing two or more alkenyl groups within each molecule, represented by an average composition formula (1) shown below:

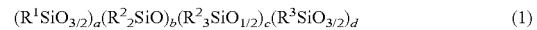

$$(R^1SiO_{3/2})_a(R^2{}_2SiO)_b(R^2{}_3SiO_{1/2})_c(R^3SiO_{3/2})_d \quad (1)$$

wherein $R^1$ represents an aryl group of 6 to 14 carbon atoms, $R^2$ represents a substituted or unsubstituted monovalent hydrocarbon group, $R^3$ represents a substituted or unsubstituted monovalent hydrocarbon group other than an aryl group, a represents a number of 0.3 to 0.9, b represents a number of 0 to 0.5, c represents a number of 0.05 to 0.7, and d represents a number of 0 to 0.2, provided that a+d is a number of 0.3 to 0.9 and a+b+c=1.0, (B) an organohydrogenpolysiloxane composed of an organohydrogenpolysiloxane (B-1) represented by a general formula (3) shown below and an organohydrogenpolysiloxane (B-2) represented by a general formula (4) shown below in a mass ratio (B-1):(B-2) within a range from 10:90 to 90:10, in an amount that provides 0.1 to 5.0 mols of silicon atom-bonded hydrogen atoms within the component (B) per 1 mol of alkenyl groups within the component (A):

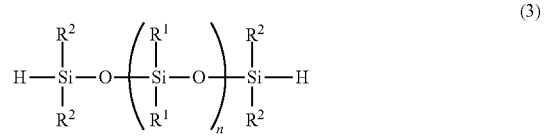

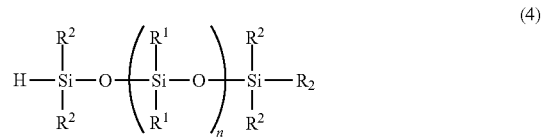

wherein $R^1$ and $R^2$ are as defined above and n represents an integer of 1 or greater, and (C) an effective amount of an addition reaction catalyst.

The composition of the present invention is useful as an encapsulating material for an optical semiconductor element.

Accordingly, the present invention also provides an optical semiconductor device having an optical semiconductor element, and an encapsulating body which is formed from a cured product of the above silicone resin composition and covers the optical semiconductor element.

The silicone resin composition of the present invention yields a cured product that exhibits low gas permeability and a small elastic modulus upon heating. As a result, even when used for encapsulating an optical semiconductor, discoloration of the lead frame is unlikely.

It is thought that the above effects are due to the fact that the aryl groups that exist at the terminals of the component (A) in the composition produce significant steric hindrance, thereby lowering the gas permeability. In other words, the component (A) is an organopolysiloxane with a three dimensional network structure in which both alkenyl groups and aryl groups are bonded to the terminal silicon atoms, and/or in which aryl groups exist in positions close to alkenyl groups bonded to the terminal silicon atoms, and when the component (A) is cured via an addition reaction, aryl groups in the cured product exist at positions near the produced silethylene bonds. As a result, it is thought that the cured product has a much more dense structure than a conventional phenyl silicone resin, meaning the gas permeability differs from, and is considerably lower than, that of a resin having conventional ($Me_2ViSiO_{1/2}$) units as the terminal units.

When the above composition of the present invention is used for encapsulating an LED, all of the merits associated with conventional silicone resin compositions are retained, so that for an LED package that is exposed to large heat and light loads, damage to the edges of the LED chip, wire breakage, and cracking at the base of the lead frame or the like can be prevented, and in addition, discoloration and blackening of the lead frame can be suppressed. In other words, by encapsulating an optical semiconductor element (such as a high-brightness LED) with a cured product of the silicone resin composition of the present invention, a highly reliable optical semiconductor device can be obtained that exhibits excellent durability, including superior resistance to discoloration and impact.

DETAILED DESCRIPTION OF THE PREFERRED EMBODIMENTS

A more detailed description of the present invention is presented below. In this description, the term "alkenyl group" includes both linear aliphatic alkenyl groups and cyclic alicyclic alkenyl groups.
—Silicone Resin Composition—

This description begins with a description of the components of the composition of the present invention.
<(A) Alkenyl Group-Containing Organopolysiloxane>

The silicone resin (A) of the present invention is a silicone resin that contains two or more silicon atom-bonded alkenyl groups within each molecule, represented by an average composition formula (1) shown below.

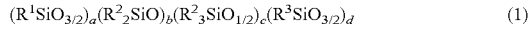

(1)

In the formula, $R^1$ represents an aryl group of 6 to 14 carbon atoms, $R^2$ represents a substituted or unsubstituted monovalent hydrocarbon group, $R^3$ represents a substituted or unsubstituted monovalent hydrocarbon group other than an aryl group, a represents a number of 0.3 to 0.9, b represents a number of 0 to 0.5, c represents a number of 0.05 to 0.7, and d represents a number of 0 to 0.2, provided that a+d is a number of 0.3 to 0.9 and a+b+c=1.0.

In the formula (1), $R^1$ represents an aryl group of 6 to 14 carbon atoms, and examples include a phenyl group, tolyl group, xylyl group and naphthyl group. A phenyl group is particularly desirable.

$R^2$ represents a substituted or unsubstituted monovalent hydrocarbon group, and is preferably a monovalent hydrocarbon group of 1 to 14 carbon atoms, and more preferably a monovalent hydrocarbon group of 1 to 6 carbon atoms. Specific examples of such $R^2$ groups include alkyl groups such as a methyl group, ethyl group, propyl group, isopropyl group, butyl group, isobutyl group, tert-butyl group, pentyl group, neopentyl group, hexyl group, octyl group, nonyl group and decyl group; alkenyl groups such as a vinyl group and allyl group; aryl groups similar to $R^1$ such as a phenyl group, tolyl group, xylyl group and naphthyl group; aralkyl groups such as a benzyl group, phenylethyl group and phenylpropyl group; and groups in which some or all of the hydrogen atoms within one of the above groups have each been substituted with a halogen atom such as a fluorine atom, bromine atom or chlorine atom, or a cyano group or the like, including halogenated alkyl groups such as a chloromethyl group, chloropropyl group, bromoethyl group and trifluoropropyl group. $R^2$ is preferably a methyl group, vinyl group or phenyl group. $R^2$ may be the same as, or different from, $R^1$. At least some of the $R^2$ groups are preferably alkenyl groups, and preferably vinyl groups.

In the above formula (1), $R^3$ represents a substituted or unsubstituted monovalent hydrocarbon group other than an aryl group, and examples include the same groups as those listed above for $R^2$, excluding the aryl groups.

The organopolysiloxane of the component (A) contains two or more, and preferably three or more, silicon atom-bonded alkenyl groups within each molecule. These alkenyl groups may exist as $R^2$ and/or $R^3$ groups in the formula (1). The alkenyl groups are typically groups of 2 to 8 carbon atoms, and preferably 2 to 6 carbon atoms, and specific examples include a vinyl group, allyl group, propenyl group, isopropenyl group, butenyl group, hexenyl group, cyclohexenyl group and octenyl group. A vinyl group or allyl group is particularly desirable.

Further, the silicon atom-bonded alkenyl group content within the organopolysiloxane is typically within a range from 0.001 to 0.2 mol/100 g, and preferably from 0.005 to 0.1 mol/100 g.

Furthermore, a represents a number of 0.3 to 0.9, and preferably 0.5 to 0.8, b represents a number of 0 to 0.5, and preferably 0 to 0.2, c represents a number of 0.05 to 0.7, and preferably 0.05 to 0.4, and d represents a number of 0 to 0.2, and preferably 0 to 0.1, provided that a+d is a number of 0.3 to 0.9, and a+b+c=1.0.

The component (A) of the present invention is an organopolysiloxane having a resin structure (namely, a three dimensional network structure). Abbreviating the $R^1SiO_{3/2}$ units that constitute the component (A) as "a units", the $R^2_2SiO$ units as "b units", the $R^2_3SiO_{1/2}$ units as "c units", and the $R^3SiO_{3/2}$ units as "d units", the molar ratio of (b+c)/(a+d) is typically within a range from 0.01 to 2, and preferably from 0.1 to 1.2, and the molar ratio of c/(a+d) is typically within a range from 0.05 to 2, and preferably from 0.1 to 1.0. Preferred compounds include those in which the majority of the component (A) is composed of a units and c units, and specifically in which a is from 0.5 to 0.8, b is from 0 to 0.2, c is from 0.05 to 0.4 and d is from 0 to 0.1, and in which at least one of the $R^2$ groups of the c units is an alkenyl group, and particularly a vinyl group. In particularly representative organopolysiloxanes of the component (A), b=0 and d=0.

The weight-average molecular weight of the organopolysiloxane of the component (A), measured by GPC and referenced against standard polystyrenes, is preferably within a range from 500 to 10,000, and more preferably from 1,000 to 4,000.

The organopolysiloxane of the component (A) can be synthesized, for example, by combining the compounds that act as the sources for the above a units, b units, c units and d units, in amounts that yield the desired molar ratio within the molar ratio ranges mentioned above, and then performing a cohydrolysis reaction in the presence of an acid.

Compounds that can be used as a unit sources include phenyltrichlorosilane, phenyltrimethoxysilane and phenyltriethoxysilane.

Compounds that can be used as b unit sources include dimethyldichlorosilane, diphenyldichlorosilane, methylphenyldichlorosilane, dimethyldimethoxysilane, diphenyldimethoxysilane and methylphenyldimethoxysilane.

Compounds that can be used as c unit sources include the compounds shown below.

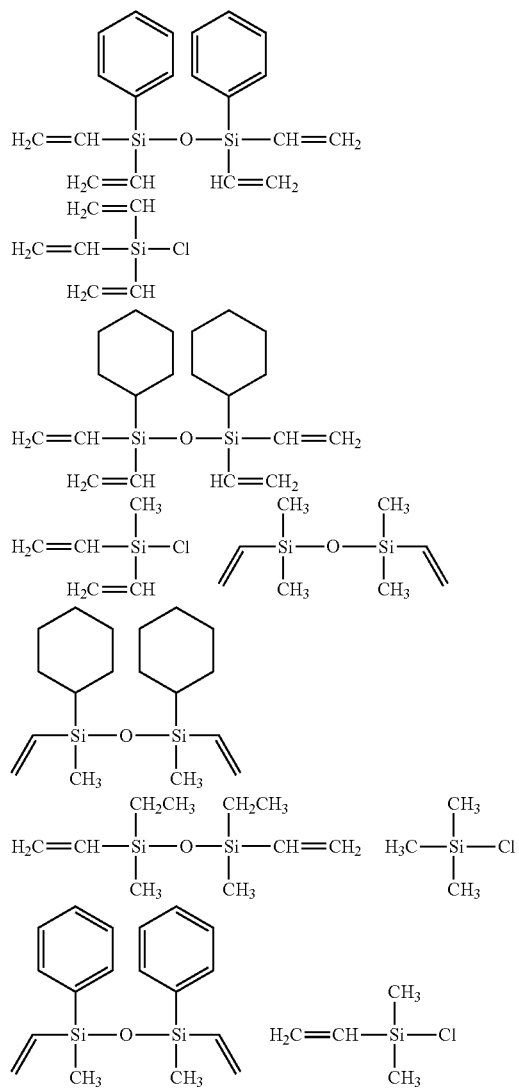

Compounds that can be used as d unit sources include cyclohexyltrichlorosilane, cyclohexyltrimethoxysilane, cyclohexyltriethoxysilane, cyclopentyltrichlorosilane, n-propyltrichlorosilane, methyltrichlorosilane, methyltrimethoxysilane and methyltriethoxysilane.

Specific examples of the organopolysiloxane represented by the above formula (1) include the compounds shown below. In the formulas below, a, b and c are the same as defined above.

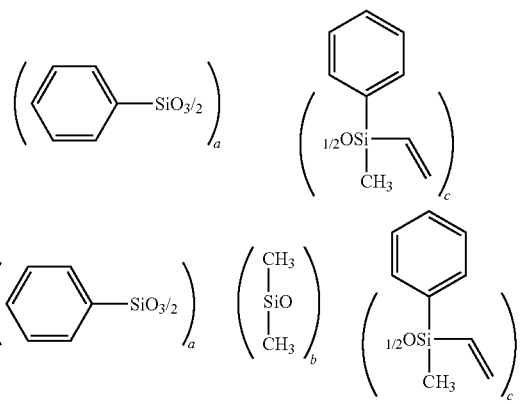

<(D) Alkenyl Group-Containing Linear Organopolysiloxane>

In the composition of the present invention, if necessary, the component (D) described below may be used as another silicon atom-bonded alkenyl group-containing organopolysiloxane, in combination with the component (A) described above. The component (D) is an optional component, but due to its connection with the component (A), is described prior to the component (B).

The organopolysiloxane of the component (D) is a linear organopolysiloxane having one or more vinyl groups bonded to the silicon atoms at both molecular chain terminals, and is represented by a general formula (5) shown below.

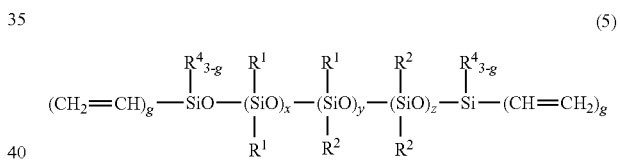

(5)

In the formula, $R^1$ and $R^2$ are the same as defined above, and $R^4$ represents a substituted or unsubstituted monovalent hydrocarbon group. g represents an integer of 1, 2 or 3, and x, y and z each represents 0 or a positive integer, provided that $1 \leq x+y+z \leq 1,000$ and at least one of x and y is an integer of 1 or greater.

In the formula (5), $R^4$ may be an aryl group that is the same as, or different from, $R^1$, or may be an unsubstituted or substituted monovalent hydrocarbon group other than an aryl group, examples of which include the same groups as those described above for $R^2$.

Each of x, y and z represents either 0 or a positive integer, provided that $1 \leq x+y+z \leq 1,000$, preferably $5 \leq x+y+z \leq 500$, and more preferably $30 \leq x+y+z \leq 500$, and provided that $0.5 < (x+y)/(x+y+z) \leq 1.0$.

Further, an organopolysiloxane for which the viscosity at 25° C. is within a range from 10 to 1,000,000 mPa·s, and preferably from 1,000 to 50,000 mPa·s, is preferred in terms of workability and curability and the like. In this description, viscosity values refer to values measured using a rotational viscometer or the like.

Specific examples of the organopolysiloxane represented by the formula (5) include the compounds shown below.

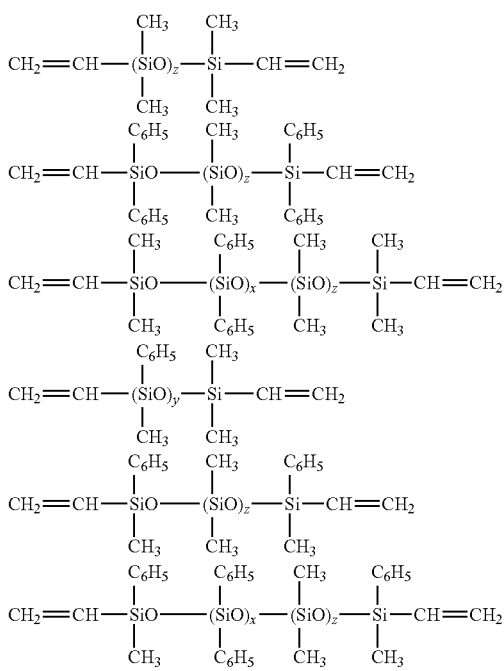

In the above formulas, x, y and z are as defined above for the formula (5).

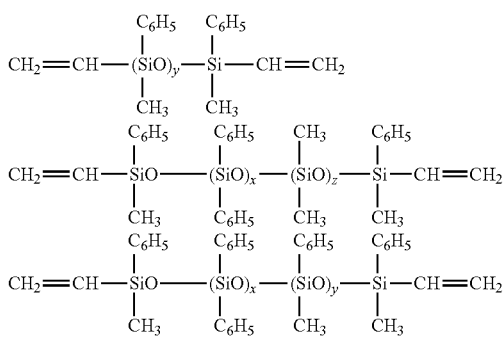

In the above formulas, x, y and z are as defined above for the formula (5).

Adding the component (D) enables the cured product to be imparted with better flexibility. The amount added of the component (D) may be selected in accordance with the properties desired of the cured product, but in those cases where the component (D) is used, the amount added is preferably within a range from 0.1 to 400 parts by mass, and more preferably from 10 to 200 parts by mass, per 100 parts by mass of the component (A). If the amount of the component (D) is too large, then the resin surface may develop tack, and the gas permeability of the cured product may increase.

<(B) Organohydrogenpolysiloxane>

The organohydrogenpolysiloxane of the component (B) of the present invention functions as a cross-linking agent, wherein the cured product is formed by an addition reaction between the hydrogen atoms bonded to silicon atoms (hereinafter also referred to as "SiH groups") within the component (B) and the silicon atom-bonded alkenyl groups within the component (A). The organohydrogenpolysiloxane of the component (B) is composed of an organohydrogenpolysiloxane (B-1) represented by a general formula (3) shown below, and an organohydrogenpolysiloxane (B-2) represented by a general formula (4) shown below, wherein the mass ratio of (B-1):(B-2) is within a range from 10:90 to 90:10.

In the above formula (5), $R^1$ and $R^2$ are the same as described above in relation to the formula (1), but $R^1$ is preferably an aryl group of 6 to 10 carbon atoms such as a phenyl group, $R^2$ is preferably an preferably an aryl group of 6 to 10 carbon atoms such as a phenyl group or a lower alkyl group of 1 to 3 carbon atoms such as a methyl group. The case in which $R^1$ and $R^2$ are both phenyl groups is particularly desirable.

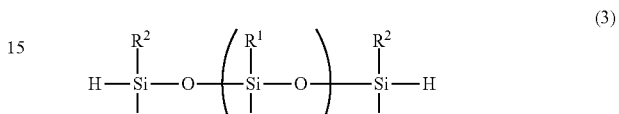

(3)

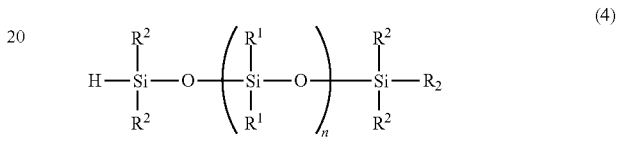

(4)

In the formulas (3) and (4), $R^1$ and $R^2$ are the same as defined above, and n represents an integer of 1 or greater, preferably an integer of 1 to 100, more preferably an integer of 1 to 20, and most preferably an integer of 1 to 10.

In the formulas (3) and (4), $R^1$ and $R^2$ are as defined above, and examples include the same groups as those listed above within the description of $R^1$ and $R^2$.

The organohydrogenpolysiloxane having silicon atom-bonded hydrogen atoms at both terminals represented by the formula (3) can be produced, for example, by a method that involves hydrolyzing a silane represented by a formula $R^1_2SiX_2$ (wherein X represents a hydrolyzable group) such as diphenyldimethoxysilane or diphenyldichlorosilane, and then blocking the chain terminals with a terminal blocking agent represented by a formula $(HSiR^2_2)_2O$ such as $(HSiMe_2)_2 O$.

The organohydrogenpolysiloxane having a silicon atom-bonded hydrogen atom at one terminal represented by the formula (4) can be produced, for example, by a method that involves hydrolyzing a silane represented by a formula $R^1_2SiX_2$ (wherein X represents a hydrolyzable group), and then blocking the chain terminals with an equimolar mixture of a terminal blocking agent represented by a formula $(HSiR^2_2)_2O$ such as $(HSiMe_2)_2O$ and a terminal blocking agent represented by a formula $(R^2_3Si)_2O$ such as $(Me_3Si)_2O$.

In the method described above for producing an organohydrogenpolysiloxane of the formula (4), organopolysiloxanes containing no SiH groups and having both terminals blocked with triorganosilyl groups are produced as by-products, but provided the amount of the organohydrogenpolysiloxane of the formula (4) satisfies the range specified in the present invention, the by-product-containing mixture can be used without any particular problems. The purity of the organohydrogenpolysiloxane of the formula (4) is preferably at least 90% by mass, and more preferably 95% by mass or greater.

The amount added of the organohydrogenpolysiloxane of the component (B) is preferably sufficient to provide 0.4 to 4.0 mols, more preferably 0.8 to 2.0 mols, and still more preferably 0.9 to 1.5 mols, of silicon atom-bonded hydrogen atoms within the component (B) per 1 mol of silicon atom-bonded alkenyl groups within the component (A). If the amount is less than the lower limit of the above range, then progression of the curing reaction may be unsatisfactory, whereas if the amount exceeds the upper limit of the above range, then a large amount of unreacted SiH groups remain in the cured product, which can cause a change in the rubber properties over time.

The aryl group content within the component (A) and the component (B) is preferably not less than 10% by mass and not more than 70% by mass, more preferably not less than 20% by mass and not more than 50% by mass, and still more preferably not less than 30% by mass and not more than 45% by mass, relative to the combined mass of the component (A) and the component (B). If the aryl group content is too low, then the gas permeability of the cured product of the composition of the present invention increases, which can lead to corrosion of the silver surface inside the LED package and a reduction in the brightness of the LED. In contrast, if the aryl group content is too high, then the heat resistance and light resistance of the cured product of the composition of the present invention may deteriorate.

<(C) Addition Reaction Catalyst>

The addition reaction catalyst of the component (C) is added to accelerate the addition reaction between the silicon atom-bonded alkenyl groups within the composition and the SiH groups within the component (B). Examples of the component (C) include platinum group metal-based catalysts such as platinum-based, palladium-based, and rhodium-based catalysts, although from the viewpoint of cost and the like, a platinum-based catalyst is preferred. Specific examples of platinum-based catalysts include $H_2PtCl_6 \cdot mH_2O$, $K_2PtCl_6$, $KHPtCl_6 \cdot mH_2O$, $K_2PtCl_4$, $K_2PtCl \cdot mH_2O$ and $PtO_2 \cdot mH_2O$ (wherein m represents a positive integer). Further, complexes of these platinum-based catalysts with hydrocarbons such as olefins, alcohols, or vinyl group-containing organopolysiloxanes can also be used. These catalysts may be used either individually, or in combinations containing two or more different catalysts.

The addition reaction catalyst need only be added in a so-called effective catalytic amount, and a typical amount, calculated as a mass of the platinum group metal relative to the mass of the component (A), is preferably within a range from 0.1 to 2,000 ppm, and more preferably from 1 to 500 ppm.

<Other Components>

If required, other optional components besides the alkenyl group-containing organopolysiloxane of the component (D) described above may also be added to the composition of the present invention, provided that there are no adverse effects on the objects and effects of the present invention.

—(E) Adhesion-Imparting Agent

Examples of adhesion-imparting agents that may be used include silane coupling agents such as vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, 3-methacryloyloxypropylmethyldimethoxysilane, 3-methacryloyloxypropyltrimethoxysilane, 3-methacryloyloxypropylmethyldiethoxysilane, 3-methacryloyloxypropyltriethoxysilane. N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, N-phenyl-3-aminopropyltrimethoxysilane and 3-mercaptopropyltrimethoxysilane, as well as trimethoxysilane, tetramethoxysilane and oligomers thereof.

Additional adhesion-imparting agents include organosilicon compounds having one or more groups selected from among a vinyl group, an epoxy group, a silicon atom-bonded alkoxy group and a silicon atom-bonded hydroxyl group within each molecule, as represented by the formulas shown below.

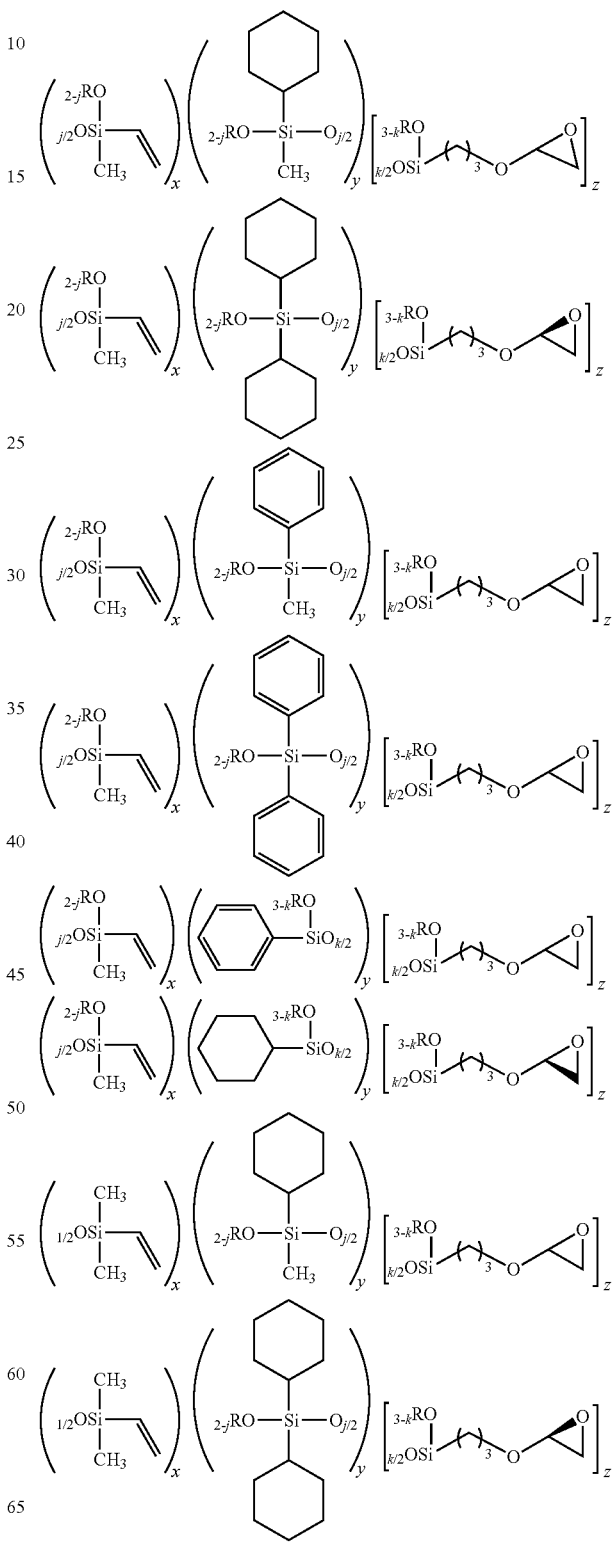

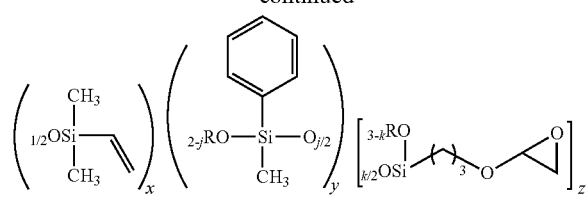
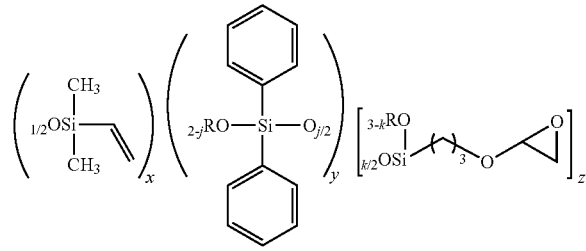
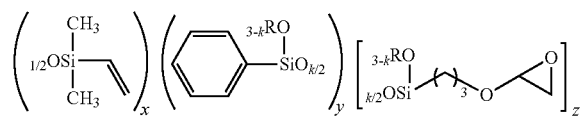
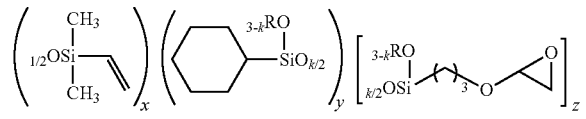
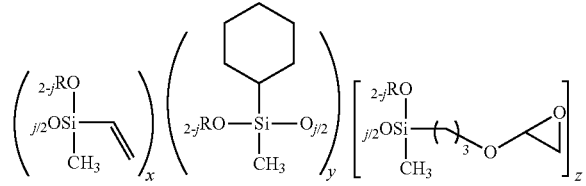
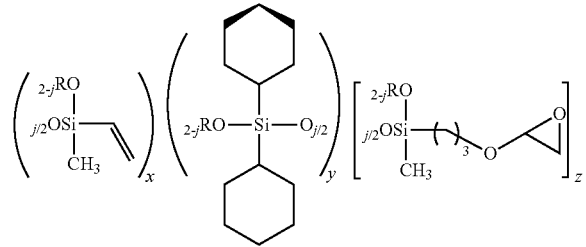
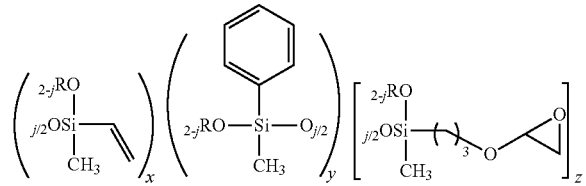
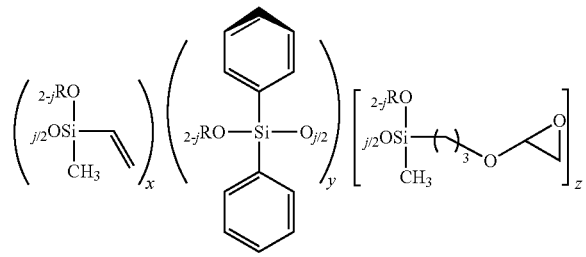
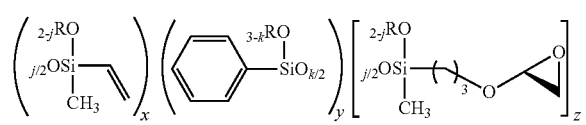
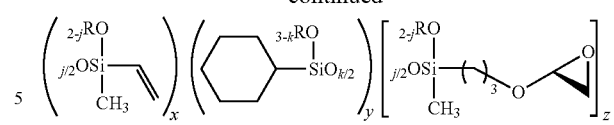
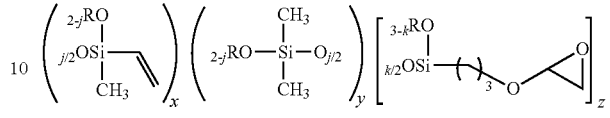
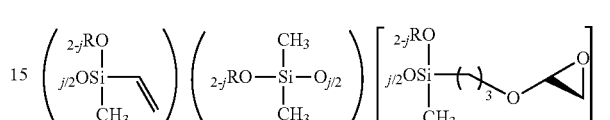
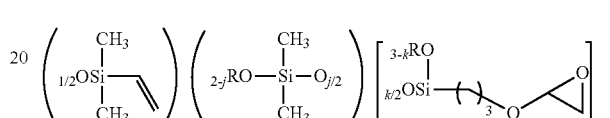
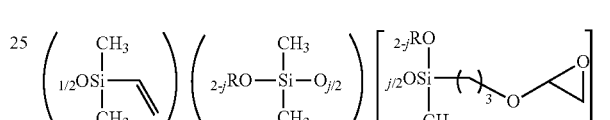
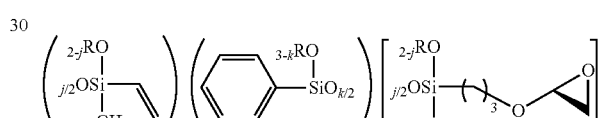
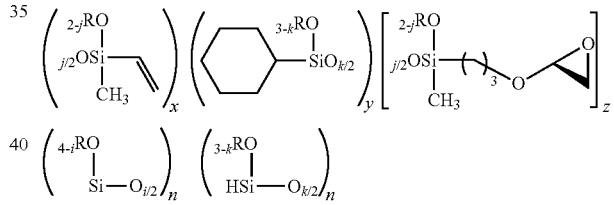

In the above formulas, R represents a substituted or unsubstituted monovalent hydrocarbon group, and where a plurality of R groups exist, the R groups may be the same or different. R is preferably a monovalent hydrocarbon group of 1 to 6 carbon atoms. Specific examples of R include alkyl groups such as a methyl group, ethyl group, propyl group, isopropyl group, butyl group, isobutyl group, tert-butyl group, pentyl group, neopentyl group, hexyl group, octyl group, nonyl group and decyl group. In each of the above formulas, each of i, j and k represents a natural number, wherein i represents 1, 2, 3 or 4, k represents 1, 2 or 3, and j represents 1 or 2. Each of x, y, and z represents a number not less than 0 and not more than 1, and satisfies x+y+z=1. n represents an integer that satisfies $1 \leq n \leq 100$. The molecular weight of the each of the compounds represented by the above formulas, reported as a weight-average molecular weight measured by GPC, is typically a number within a range from 1,000 to 20,000, preferably from 1,000 to 10,000, and more preferably from 1,000 to 6,000.

Of the above compounds, the use of an adhesion-imparting agent represented by the formula shown below is particularly desirable.

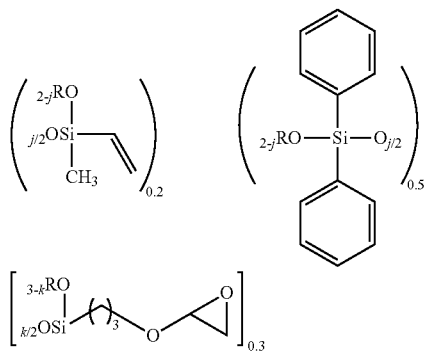

In the formula, R, j and h are the same as defined above.

The above adhesion-imparting agents may be used individually, or two or more different adhesion-imparting agents may be used as a mixture.

The adhesion-imparting agent is preferably used in an amount within a range from 0.1 to 20 parts by mass, and more preferably 0.5 to 10 parts by mass, per 100 parts by mass of the component (A). If the amount of the adhesion-imparting agent is too large, then the cured product of the composition may become prone to developing cracks, and the reliability of the composition as an encapsulating material may deteriorate.

—(F) Condensation Catalyst

A condensation catalyst may also be added to the composition of the present invention. Examples of the condensation catalyst include tin (II) and tin (IV) compounds such as tin dilaurate, di-n-butyltin dilaurate, tin dioctoate, tin bis(2-ethylhexanoate), tin bis(neodecanoate), di-n-butyldiacetoxy tin and tetrabutyl tin, titanium compounds such as titanium tetraisopropoxide, titanium tetraoctoxide, titanium tetra-n-butoxide, titanium butoxide dimer, titanium tetra-2-ethylhexoxide, titanium diisopropoxybis(acetylacetonate), titanium dioctyloxybis(octylene glycolate) and titanium diisopropoxybis(ethylacetoacetate), aluminum compounds such as aluminum tris(acetylacetonate), aluminum tris(acetoacetate) and aluminum tris(sec-butoxide), nickel compounds such as nickel bis(acetylacetonate), cobalt compounds such as cobalt tris(acetylacetonate), zinc compounds such as zinc bis(acetylacetonate), zirconium compounds such as zirconium tetra (normal-propoxide), zirconium tetra(normal-butoxide), zirconium tetra(acetylacetonate), zirconium tributoxy-mono (acetylacetonate), zirconium monobutoxy-acetylacetonate, zirconium dibutoxy-bis(ethylacetoacetate), zirconium tetra (acetylacetonate) and zirconium tributoxy-monostearate. These catalysts may be used individually, or in combinations containing two or more catalysts. The use of a zirconium-based catalyst having superior resistance to discoloration and excellent reactivity, such as the Orgatics ZA series of catalysts (manufactured by Matsumoto Trading Co., Ltd.), is particularly desirable.

The amount added of the component (F) is typically within a range from 0 to 5 parts by mass, and preferably from 0.0001 to 2 parts by mass, per 100 parts by mass of the component (A).

—(G) Inorganic Filler

If required, an inorganic filler may also be added to the silicone composition of the present invention. Examples of the inorganic filler include reinforcing inorganic fillers such as fumed silica and fumed titanium dioxide, and non-reinforcing inorganic fillers such as calcium carbonate, calcium silicate, titanium dioxide, ferric oxide, carbon black and zinc oxide.

The inorganic filler is typically added in an amount within a range from 0 to approximately 300 parts by mass per 100 parts by mass of the component (A), but when the composition is to be used in an application that requires transparency, an inorganic filler is preferably not added.

—(H) Antioxidant

In the composition of the present invention, the component (A) is an organopolysiloxane resin that contains aryl groups, and because aryl-containing silicones have inferior heat resistance compared with dimethyl silicones, an appropriate amount of an antioxidant may be added to the composition.

Examples of the antioxidant include pentaerythritol tetrakis[3-(3,5-di-tert-butyl-4-hydroxyphenyl)propionate], N,N'-propane-1,3-diylbis[3-(3,5-di-tert-butyl-4-hydroxyphenyl)propionamide], thiodiethylenebis[3-(3,5-di-tert-butyl-4-hydroxyphenyl)propionate], octadecyl-3-(3,5-di-tert-butyl-4-hydroxyphenyl)propionate, 6,6'-di-tert-butyl-2,2'-thiodi-p-cresol, N,N'-hexane-1,6-diylbis[3-(3,5-di-tert-butyl-4-hydroxyphenylpropionamide)], benzenepropanoic acid, 3,5-bis(1,1-dimethylethyl)-4-hydroxy-alkyl ester having C7-C9 side chain, diethyl[[3,5-bis(1,1-dimethylethyl)-4-hydroxyphenyl]methyl]phosphonate, 2,2'-ethylidenebis[4,6-di-tert-butylphenol], 3,3',3'',5,5',5''-hexa-tert-butyl-a,a',a''-(mesitylene-2,4,6-triyl)tri-p-cresol, calcium diethylbis[[[3,5-bis(1,1-dimethylethyl)-4-hydroxyphenyl]methyl] phosphonate], 4,6-bis(octylthiomethyl)-o-cresol, 4,6-bis (dodecylthiomethyl)-o-cresol, ethylenebis(oxyethylene)bis [3-(5-tert-butyl-4-hydroxy-m-tolyl)propionate], hexamethylenebis[3-(3,5-di-tert-butyl-4-hydroxyphenyl) propionate], 1,3,5-tris(3,5-di-tert-butyl-4-hydroxybenzyl)-1, 3,5-triazine-2,4,6-trione, 1,3,5-tris[(4-tert-butyl-3-hydroxy-2,6-xylyl)-methyl]-1,3,5-triazine-2,4,6-(1H,3H,5H)-trione, 6,6'-di-tert-butyl-4,4'-thiodi-m-cresol, diphenylamine, reaction product of N-phenylbenzenamine and 2,4,4-trimethylpentene, 2,6-di-tert-butyl-4-(4,6-bis(octylthio)-1,3,5-triazin-2-ylamino)phenol, 3,4-dihydro-2,5,7,8-tetramethyl-2-(4,8, 12-trimethyltridecyl)-2H-1-benzopyran-6-ol, 2',3-bis[[3-[3, 5-di-tert-butyl-4-hydroxyphenyl]propionyl]] propionohydrazide, didodecyl 3,3'-thiodipropionate and dioctadecyl 3,3'-thiodipropionate. Preferred antioxidants include Irganox 245, 259, 295, 565, 1010, 1035, 1076, 1098, 1135, 1130, 1425WL, 1520L, 1726, 3114 and 5057 (manufactured by BASF Japan Ltd.). These antioxidants may also be used also in mixtures containing two or more antioxidants.

—Other Additives

Other conventional additives may also be added to the composition of the present invention as required. Examples of such additives include light degradation inhibitors such as hindered amines, and reactive diluents such as vinyl ethers, vinyl amides, epoxy resins, oxetanes, allyl phthalates and vinyl adipate. These additives may be added in appropriate amounts that do not impair the objects of the present invention.

<Method of Preparing Silicone Resin Composition>

The silicone resin composition of the present invention is prepared by stirring, dissolving, mixing and/or dispersing the above components, either simultaneously or in separate batches, and where necessary while applying heat. Typically, in order to prevent the curing reaction from proceeding prior to use of the composition, the composition is stored as two separate liquids containing, for example, the components (A), (B) and (C), and the components (B) and (E) respectively, with the two liquids being mixed together at the time of use to effect curing. If the component (C) and the component (E) are stored within the same liquid, then there is a possibility of a dehydrogenation reaction occurring, and therefore the component (C) and the component (E) are preferably separated during storage. Alternatively, the composition may be used as a single liquid containing a small amount of an added curing retarder such as an acetylene alcohol.

There are no particular limitations on the device used during the stirring operation, and examples of devices that may be used include a grinding machine having mixing and heating functions, a triple roll mill, a ball mill and a planetary mixer. Further, appropriate combinations of these devices may also be used. The viscosity of the obtained silicone resin composition, measured at 25° C. using a rotational viscometer, is typically within a range from 100 to 10,000,000 mPa·s, and preferably from 300 to approximately 500,000 mPa·s.

The silicone resin composition obtained in this manner may be cured immediately by heating if required, and because the cured product exhibits a high degree of transparency and excellent adhesion to metal substrates and package materials such as LCPs, the silicone resin composition is ideal for encapsulating optical semiconductor elements. Examples of these optical semiconductor elements include LEDs, photodiodes, CCDs and CMOS and photocouplers, and the composition of the present invention is particularly useful for encapsulating LEDs.

The method of encapsulating an optical semiconductor device using a cured product of the silicone resin composition according to the present invention can employ conventional methods appropriate for the type of optical semiconductor element. Although there are no particular limitations on the curing conditions for the silicone resin composition, curing is typically performed at a temperature of 40 to 250° C., and preferably 60 to 200° C., for a period of 5 minutes to 10 hours, and preferably 30 minutes to 6 hours.

When a silver plated lead frame is encapsulated, the surface of the silver plated lead frame is preferably subjected to a preliminary surface treatment in order to increase the wettability with the silicone resin composition. From the viewpoints of workability and equipment maintenance and the like, the surface treatment is preferably a dry treatment such as an ultraviolet light treatment, an ozone treatment or a plasma treatment. A plasma treatment is particularly desirable. In order to increase the compatibility with the silicone resin composition, the material of the pre-molded package preferably has a silicone component content equivalent to at least 15% of the total mass of organic components. This silicone component is defined as compounds having Si units and polymers thereof. If the silicone component content is less than 15% by mass of the total mass of organic components, then because the compatibility with the silicone resin composition deteriorates, voids may occur between the silicone resin composition and the inner walls of the pre-molded package during encapsulation, resulting in an optical semiconductor device that is prone to cracking.

When formed as a sheet-like cured product having a thickness of 1 mm, the cured product of the silicone resin composition of the present invention exhibits a water vapor permeation rate that is preferably not more than 15 g/m²·day, more preferably within a range from 1 to 15 g/m²·day, and still more preferably from 5 to 15 g/m²·day. The water vapor permeation rate refers to a value measured by the Lyssy method (using an L80-5000 apparatus, manufactured by Lyssy Co., Ltd.) in accordance with JIS K 7129.

A cured product of the silicone resin composition of the present invention exhibits low gas permeability, and an optical semiconductor device encapsulated within such a cured product is resistant to discoloration of the cured product, meaning the optical semiconductor device exhibits excellent durability.

EXAMPLES

The present invention is described below in further detail based on a series of examples and comparative examples, but the present invention is in no way limited by the examples presented below.

Synthesis Example 1

Synthesis of Component (A)

A flask was charged with 1,000 g of xylene and 5,014 g of water, and a mixture containing 2,285 g (10.8 mol) of phenyltrichlorosilane, 326 g (2.70 mol) of vinyldimethylchlorosilane and 1,478 g of xylene was then added dropwise to the flask. Following completion of the dropwise addition, the resulting mixture was stirred for 3 hours, the waste acid was separated, and the remaining mixture was washed with water. Following subsequent azeotropic dehydration, 6 g (0.15 mol) of KOH was added to the flask, and the resulting mixture was refluxed overnight under heating at 150° C. The resulting mixture was neutralized with 27 g (0.25 mol) of trimethylchlorosilane and 24.5 g (0.25 mol) of potassium acetate, and following filtering, the solvent was removed by distillation under reduced pressure, completing synthesis of a siloxane resin having an average composition formula shown below. The weight-average molecular weight of the thus obtained siloxane resin, measured by GPC and referenced against standard polystyrenes, was 1,820, and the vinyl content was 0.131 mol/100 g. This resin is termed "resin 1".

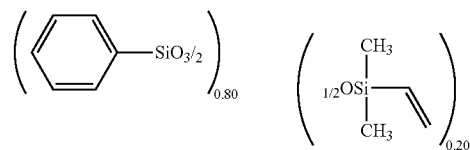

Synthesis Example 2

Synthesis of Component (A)

A flask was charged with 1,142 g of xylene and 4,629 g of water, and a mixture containing 1,480.5 g (7 mol) of phenyltrichlorosilane, 361.5 g (3 mol) of dimethylvinylchlorosilane and 1,712 g of xylene was then added dropwise to the flask. Following completion of the dropwise addition, the resulting mixture was stirred for 3 hours, the waste acid was separated, and the remaining mixture was washed with water. Following subsequent azeotropic dehydration, 20.64 g (0.184 mol) of a 50% by mass aqueous solution of KOH was added to the flask, and the resulting mixture was refluxed overnight under heat at an internal temperature of 150° C. The resulting mixture was neutralized with 34.0 g (0.313 mol) of trimethylchlorosilane and 30.7 g (0.313 mol) of potassium acetate, and following filtering, the solvent was removed by distillation under reduced pressure, the product was washed with methanol, and any residual methanol was removed by distillation under reduced pressure. This completed the synthesis of a siloxane resin having an average composition formula shown below. The weight-average molecular weight of the thus obtained siloxane resin, measured by GPC and referenced against standard polystyrenes, was 1,770, and the vinyl content was 0.186 mol/100 g. This resin is termed "resin 2".

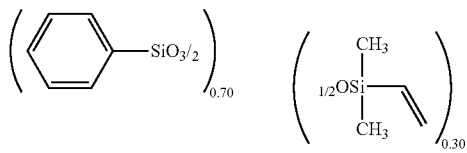

Synthesis Example 3

Synthesis of Component (B-1)

A flask was charged with 5,376 g (22.0 mol) of diphenyldimethoxysilane and 151.8 g of acetonitrile, the solution was cooled to 10° C. or lower, and the dropwise reactions described below were performed at an internal temperature of 10° C. or lower. Namely, 303.69 g of concentrated sulfuric acid was added dropwise to the flask, 940.36 g of water was then added dropwise over a period of one hour, 2,216 g (16.5 mol) of $(HSiMe_2)_2O$ was subsequently added dropwise, and the resulting mixture was then stirred overnight. Subsequently, the waste acid was separated, and following washing of the reaming mixture with water, the solvent was removed by distillation under reduced pressure, yielding an organohydrogenpolysiloxane 1 of the structure shown below. The amount of produced hydrogen gas was 90.32 ml/g (0.403 mol/100 g). This organohydrogenpolysiloxane is termed "cross-linking agent 1".

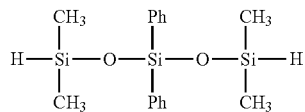

Synthesis Example 4

Synthesis of Component (B-2)

A flask was charged with 5,376 g (22.0 mol) of diphenyldimethoxysilane and 151.8 g of acetonitrile, the solution was cooled to 10° C. or lower, and the dropwise reactions described below were performed at an internal temperature of 10° C. or lower. Namely, 303.69 g of concentrated sulfuric acid was added dropwise to the flask, 940.36 g of water was then added dropwise over a period of one hour, a mixture of 1105.5 g (8.25 mol) of $(HSiMe_2)_2O$ and 1,336.5 g (8.25 mol) of $(Me_3Si)_2O$ was subsequently added dropwise, and the resulting mixture was then stirred overnight. Subsequently, the waste acid was separated, and following washing of the reaming mixture with water, the solvent was removed by distillation under reduced pressure, yielding an organohydrogenpolysiloxane 2 of the structure shown below. The amount of produced hydrogen gas was 57 ml/g (0.257 mol/100 g). This organohydrogenpolysiloxane is termed "cross-linking agent 2".

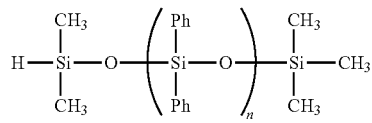

In the above formula, n=2.0 (average)

Synthesis Example 5

Synthesis of Adhesion-Imparting Agent

A flask was charged with 264.46 g (2.00 mol) of vinylmethyldimethoxysilane, 732 g (3.00 mol) of diphenyldimethoxysilane, 1,181.5 g (5.00 mol) of 3-glycidoxypropyltrimethoxysilane and 2,700 ml of IPA, 82.00 g of a 25% by mass aqueous solution of tetramethylammonium hydroxide and 740 g of water were then mixed together and added to the flask, and the resulting mixture was stirred for 3 hours. Toluene was then added, and the resulting mixture was neutralized with an aqueous solution of sodium dihydrogen phosphate, and then washed with water. The solvent was then removed by distillation under reduced pressure, completing synthesis of an adhesion-imparting agent having a structure represented by the formula shown below. The vinyl content was 0.098 mol/100 g. In the following description this product is termed "adhesion-imparting agent 1".

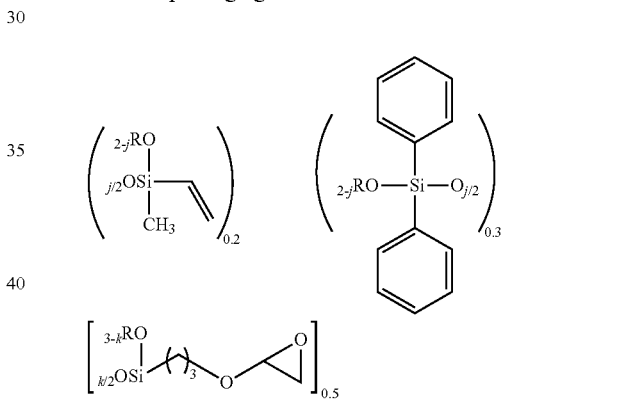

In the above formula, k represents 1, 2 or 3, j represents 1 or 2, and R represents a hydrogen atom or a methyl group, with the adhesion-imparting agent 1 existing as a mixture of these compounds.

Examples 1 to 4

Comparative Examples 1 and 2

The components prepared in the synthesis examples 1 to 5 and the components listed below were mixed together in the amounts shown in Table 1, thus preparing a series of silicone resin compositions.

(C) Platinum catalyst: an octyl alcohol-modified solution of chloroplatinic acid (platinum concentration: 2% by mass).

Component (D): a phenylmethylpolysiloxane with both molecular chain terminals blocked with vinyl groups, represented by a formula shown below (phenyl content: 30% by mass, vinyl content: 0.0593 mol/100 g). In Table 1, this compound is termed "vinylphenylsiloxane".

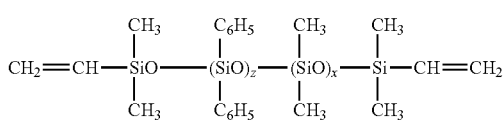

In the formula, x represents 9 and z represents 19.

Cross-linking agent 3: a phenyl group-containing branched methylhydrogenpolysiloxane represented by a formula shown below (amount of produced hydrogen gas: 170.24 ml/g (0.760 mol/100 g)).

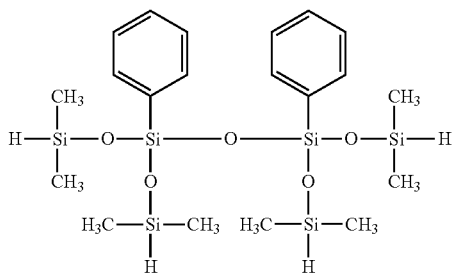 [SMILES: C[SiH](C)O[Si](O[SiH](C)C)(O[Si](O[SiH](C)C)(O[SiH](C)C)c1ccccc1)c1ccccc1]

<Evaluation of Cured Product Properties>
—External Appearance

Each of the silicone resin compositions of the examples 1 to 4 and the comparative examples 1 and 2 was molded under heat (length×width×thickness=110 mm×120 mm×2 mm) for 4 hours at 150° C. to form a cured product, and the external appearance of the cured product was evaluated visually.
—Mechanical Properties For each cured product, the tensile strength, the hardness (measured using a type A and type D spring tester) and the elongation were measured in accordance with JIS K 6301.
—Moisture Permeation Rate The moisture permeation rate was measured by the Lyssy method (using an L80-5000 apparatus, manufactured by Lyssy Co., Ltd.) in accordance with JIS K 7129.

<Preparation of LED Devices>

Using each of the silicone resin compositions prepared in the examples 1 to 4 and the comparative examples 1 and 2, a series of optical semiconductor devices encapsulated within cured products of the silicone resin compositions were prepared in the manner described below.

A cup-shaped premolded package for an LED (3 mm×3 mm×1 mm, diameter of opening: 2.6 mm) having a copper lead frame plated with silver of thickness 2 μm provided on the bottom surface of the package was treated with an Ar plasma (output: 100 W, irradiation time: 10 seconds) under reduced pressure conditions. An electrode of an InGaN blue light emitting element was connected to the bottom surface lead frame using a silver paste (conductive adhesive), and the counter electrode of the light emitting element was connected to the counter lead frame using a gold wire. The silicone resin composition was then injected into the opening of the package, and then cured by heating at 60° C. for one hour and then at 150° C. for a further 4 hours, thereby encapsulating the light emitting element.
—Sulfide Test Each of the LED devices produced in this manner was lit by passing a current of 25 mA through the device, and hydrogen sulfide was then generated at a concentration of 10 ppm, and the lit LED device was left to stand in the hydrogen sulfide atmosphere at 100° C. for 100 hours. The degree of discoloration in the vicinity of the silver plated surface inside the package was then evaluated visually.
—Temperature Cycling Test Five of the prepared LED devices were subjected to 500 cycles of a temperature cycling test, wherein each cycle consisted of holding the devices at −40° C. for 10 minutes, and then placing the devices at 100° C. for 10 minutes. The devices were then inspected visually for external appearance and any other noticeable defects, and in the case of n defects, the fraction defective was reported as n/5.
—High-Temperature, High-Humidity Lighting Test Five of the prepared LED devices were subjected to a 1000-hour LED lighting test under conditions of 60° C. and 90% RH, and the devices were then inspected visually for adhesion faults at the package interface, the existence of cracks, and the existence of discoloration. In the case of n defects other than external appearance defects, the fraction defective was reported as n/5.

The results are shown in Table 1. The units "parts" represents "parts by mass".

TABLE 1

|  |  | Example 1 | Example 2 | Example 3 | Example 4 | Comparative example 1 | Comparative example 2 |
|---|---|---|---|---|---|---|---|
| Si—H/Si—Vi ratio |  |  |  |  | 1.1 |  |  |
| (A) Resin 1 | parts | 79.5 | 100 | 79.5 |  |  | 60 |
| (A) Resin 2 | parts |  |  |  | 60.0 | 60.0 |  |
| Vinylphenylsiloxane | parts | 8 | 15.5 | 15 | 12 | 15 | 15 |
| (B-1) Cross-linking agent 1 | parts | 20.6 | 15.4 | 7.4 | 35.6 | 40 | 40 |
| (B-2) Cross-linking agent 2 | parts | 23.1 | 40 | 43.16 | 18.72 |  |  |
| Cross-linking agent 3 | parts |  |  |  |  | 6 |  |
| VF | parts |  |  |  |  |  |  |
| Platinum catalyst | parts | 0.02 | 0.02 | 0.02 | 0.02 | 0.02 | 0.02 |
| Condensation catalyst | parts | 0.03 | 0.03 | 0.03 | 0.03 | 0.03 | 0.03 |
| Adhesion-imparting agent 1 | parts | 2.3 | 2.3 | 3.5 | 2.3 | 2.3 | 4 |
| Following curing | External appearance | colorless transparent | colorless transparent | colorless transparent | colorless transparent | colorless transparent | colorless transparent |
| Hardness | Type A | 96 | 81 | 86 | 83 | 89 | 83 |
|  | Type D | 52 | 20 | 30 | 22 | 40 | 22 |
| Tensile strength | MPa | 4.6 | 1 | 1.3 | 1.9 | 1.1 | 1.9 |
| Elongation | % | 56 | 180 | 133 | 65 | 25 | 65 |
| 100° C. Young's modulus | MPa | 5 | 1 | 1 | 2 | 12 | 15 |
| Moisture permeation rate | g/m² · day | 9 | 13 | 12 | 14 | 12 | 21 |
| Sulfide test (10 ppm H2S. 100° C. 100 hours) |  | colorless transparent | colorless transparent | colorless transparent | colorless transparent | black discoloration | black discoloration |

TABLE 1-continued

|  | Example 1 | Example 2 | Example 3 | Example 4 | Comparative example 1 | Comparative example 2 |
|---|---|---|---|---|---|---|
| Temperature cycling test (−40 ⇔ 100° C., 500 cycles) fraction defective, external appearance | 0/5, colorless transparent | 0/5, colorless transparent | 0/5, colorless transparent | 0/5, colorless transparent | 5/5 (wire breaks and peeling), colorless transparent | 3/5 (wire breaks), colorless, transparent |
| High-temperature high-humidity lighting test (60° C./90% RH, 1,000 hr), fraction defective, external appearance | 0/5, colorless transparent | 0/5, colorless transparent | 0/5, colorless transparent | 0/5, colorless transparent | 5/5 (peeling), colorless transparent | 1/5 (peeling), colorless transparent |

As is evident from Table 1, the cured products of the silicone resin compositions of the present invention exhibited low moisture permeability and suffered no discoloration even in the sulfide test. Further, even in the temperature cycling test and the high-temperature, high-humidity lighting test, no defects such as cracking or peeling were observed.

The silicone resin composition of the present invention yields a cured product having low gas permeability, and can provide an optical semiconductor device having excellent resistance to gas permeation, and is therefore very useful for encapsulating optical semiconductor elements.

What is claimed is:

1. A silicone resin composition comprising:
   (A) an organopolysiloxane containing two or more alkenyl groups within each molecule, represented by an average composition formula (1) shown below:

$$(R^1SiO_{3/2})_a(R^2_2SiO)_b(R^2_3SiO_{1/2})_c(R^3SiO_{3/2})_d \quad (1)$$

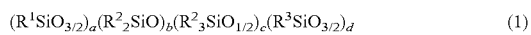

wherein $R^1$ represents an aryl group of 6 to 14 carbon atoms, $R^2$ represents a substituted or unsubstituted monovalent hydrocarbon group, $R^3$ represents a substituted or unsubstituted monovalent hydrocarbon group other than an aryl group, a represents a number of 0.3 to 0.9, b represents a number of 0 to 0.5, c represents a number of 0.05 to 0.7, and d represents a number of 0 to 0.2, provided that a+d is a number of 0.3 to 0.9 and a+b+c=1.0,
   (B) an organohydrogenpolysiloxane, composed of an organohydrogenpolysiloxane (B-1) represented by a general formula (3) shown below and an organohydrogenpolysiloxane (B-2) represented by a general formula (4) shown below in a mass ratio (B-1):(B-2) within a range from 10:90 to 90:10,
   in an amount that provides 0.4 to 4.0 mols of silicon atom-bonded hydrogen atoms within the component (B) per 1 mol of alkenyl groups within the component (A):

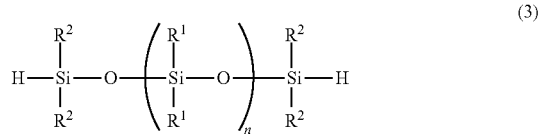

(3)

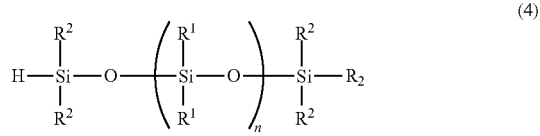

(4)

wherein $R^1$ and $R^2$ are as defined above and n represents an integer of 1 or greater, and
   (C) an effective amount of an addition reaction catalyst.

2. The silicone resin composition according to claim 1, further comprising:
   (D) an organopolysiloxane represented by a composition formula (5) shown below, in an amount within a range from 0.1 to 400 parts by mass per 100 parts by mass of the component (A):

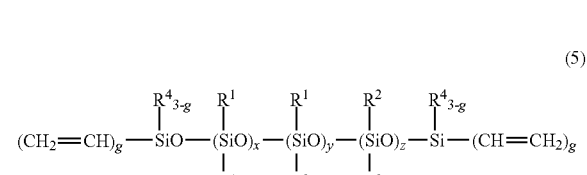

(5)

wherein $R^1$ and $R^2$ are as defined above, $R^4$ represents a substituted or unsubstituted monovalent hydrocarbon group, g represents an integer of 1, 2 or 3, and x, y and z each represents 0 or a positive integer, provided that $1 \leq x+y+z \leq 1{,}000$ and at least one of x and y is an integer of 1 or greater.

3. The silicone resin composition according to claim 1, further comprising an adhesion-imparting agent (E).

4. The silicone resin composition according to claim 1, further comprising a condensation catalyst (F).

5. The silicone resin composition according to claim 1, wherein the Young's modulus at 100° C. of a cured product of the composition is not more than 10 MPa.

6. The silicone resin composition according to claim 1, wherein a water vapor permeation rate of a sheet-like cured product of the composition having a thickness of 1 mm is not more than 15 g/m²·day.

7. The silicone resin composition according to claim 1, wherein the composition is used as an encapsulating material for an optical semiconductor element.

8. An optical semiconductor device, comprising an optical semiconductor element, and an encapsulating body which is formed from a cured product of the silicone resin composition defined in claim 1 and covers the optical semiconductor element.

* * * * *